(12) United States Patent
Yamaguchi et al.

(10) Patent No.: US 10,497,494 B2
(45) Date of Patent: Dec. 3, 2019

(54) SUPERCONDUCTING WIRE

(71) Applicant: Sumitomo Electric Industries, Ltd., Osaka-shi, Osaka (JP)

(72) Inventors: Takashi Yamaguchi, Osaka (JP); Tatsuoki Nagaishi, Osaka (JP); Masaya Konishi, Osaka (JP); Kotaro Ohki, Osaka (JP); Genki Honda, Osaka (JP); Tatsuhiko Yoshihara, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 218 days.

(21) Appl. No.: 15/320,923

(22) PCT Filed: Mar. 16, 2015

(86) PCT No.: PCT/JP2015/057645
§ 371 (c)(1),
(2) Date: Dec. 21, 2016

(87) PCT Pub. No.: WO2016/017205
PCT Pub. Date: Feb. 4, 2016

(65) Prior Publication Data
US 2017/0140852 A1 May 18, 2017

(30) Foreign Application Priority Data
Jul. 31, 2014 (JP) .................. 2014-156615

(51) Int. Cl.
*H01B 12/06* (2006.01)
*H01F 6/06* (2006.01)
(Continued)

(52) U.S. Cl.
CPC ............ *H01B 12/06* (2013.01); *C23C 14/08* (2013.01); *C23C 14/22* (2013.01); *C23C 14/24* (2013.01);
(Continued)

(58) Field of Classification Search
CPC ...... H01L 39/24–39/2487; H01B 12/00–12/10
See application file for complete search history.

(56) References Cited

U.S. PATENT DOCUMENTS 9,002,424 B2 * 4/2015 Nagasu ............... H01L 39/2454
505/230
2013/0137579 A1 5/2013 Nagasu et al.
(Continued)

FOREIGN PATENT DOCUMENTS

CN 1400612 A 3/2003
CN 1596479 3/2005
(Continued)

OTHER PUBLICATIONS

U.S. Appl. No. 15/320,935, filed Dec. 21, 2016, Takashi Yamaguchi et al.
(Continued)

*Primary Examiner* — Colleen P Dunn
(74) *Attorney, Agent, or Firm* — Drinker Biddle & Reath LLP

(57) ABSTRACT

A superconducting wire includes: a substrate having a first main surface and a second main surface opposite to the first main surface; and a superconducting material layer disposed on the first main surface of the substrate. The superconducting material layer is disposed to cover at least a part of a side surface of the substrate in a width direction of the substrate.

8 Claims, 21 Drawing Sheets

(51) Int. Cl.
  *C23C 14/08* (2006.01)
  *C23C 14/24* (2006.01)
  *C23C 14/22* (2006.01)
  *C23C 28/00* (2006.01)
(52) U.S. Cl.
  CPC .......... *C23C 28/321* (2013.01); *C23C 28/345* (2013.01); *H01F 6/06* (2013.01); *Y02E 40/642* (2013.01)

(56) References Cited

U.S. PATENT DOCUMENTS

| | | |
|---|---|---|
| 2013/0217581 A1 | 8/2013 | Yoshizumi et al. |
| 2015/0038334 A1 | 2/2015 | Nagasu et al. |
| 2018/0202800 A1* | 7/2018 | Sakurai ................. G01N 21/84 |

FOREIGN PATENT DOCUMENTS

| | | |
|---|---|---|
| CN | 103189934 A | 7/2013 |
| JP | 2004-031128 A | 1/2004 |
| JP | 2012-169237 | 9/2012 |
| JP | 2013-012406 A | 1/2013 |
| JP | 2013-246881 A | 12/2013 |
| WO | WO 03/047006 | 6/2003 |
| WO | WO-2013/018870 A1 | 2/2013 |
| WO | WO-2013/157286 A1 | 10/2013 |

OTHER PUBLICATIONS

U.S. Appl. No. 15/774,036, filed May 7, 2018, Takashi Yamaguchi et al.
Office Action dated Jan. 11, 2019 that issued in U.S. Appl. No. 15/320,935.
Notice of Allowance dated Apr. 10, 2019 that issued in U.S. Appl. No. 15/320,935.
Notice of Allowance dated Jun. 20, 2019 that issued in U.S. Appl. No. 15/320,935.
U.S. Appl. No. 16/574,907, Yamaguchi, filed Sep. 18, 2019.

* cited by examiner

SUPERCONDUCTING WIRE

TECHNICAL FIELD

The present invention relates to a superconducting wire, and more specifically relates to a superconducting wire in which a superconducting material layer is formed on a substrate.

BACKGROUND ART

In recent years, development of a superconducting wire in which a superconducting material layer is formed on a metal substrate has been in progress. In particular, an oxide superconducting wire is of interest which includes a superconducting material layer made of an oxide superconductor which is a high-temperature superconductor having a transition temperature equal to or more than the liquid nitrogen temperature.

Such an oxide superconducting wire is generally manufactured by forming an intermediate layer on an orientation-aligned metal substrate, forming an oxide superconducting material layer on the intermediate layer, and further forming a stabilizing layer of silver (Ag) or copper (Cu) (see for example Japanese Patent Laying-Open No. 2013-12406 (PTD 1)).

CITATION LIST

Patent Document

PTD 1: Japanese Patent Laying-Open No. 2013-12406

SUMMARY OF INVENTION

Technical Problem

The superconducting wire configured in the above-described manner has a multilayer structure in which a ceramic layer constituted of the intermediate layer and the superconducting material layer is formed on the metal substrate. When such a superconducting wire is cooled to the critical temperature, a difference in thermal expansion coefficient between the metal substrate and the ceramic layer causes a tensile stress to be applied from the metal layer to the ceramic layer in the multilayer structure. However, the ceramic layer cannot be stretched by the tensile stress. Therefore, the bonding strength at the interface between the metal substrate and the ceramic layer is decreased, resulting in a problem of occurrence of local peeling at the edges of the ceramic layer. Due to this, in a part of the superconducting material layer, breakage, deformation, or the like is likely to occur, leading to deterioration of the superconducting properties.

An object of the present invention is to provide a superconducting wire having stable superconducting properties, by suppressing local peeling of the superconducting material layer.

Solution to Problem

A superconducting wire according to an aspect of the present invention includes: a substrate having a first main surface and a second main surface opposite to the first main surface; and a superconducting material layer disposed on the first main surface of the substrate. The superconducting material layer is disposed to cover at least a part of a side surface of the substrate in a width direction of the substrate.

Advantageous Effects of Invention

According to the foregoing, in the superconducting wire in which the superconducting material layer is formed on the substrate, local peeling of the superconducting material layer can be suppressed. In this way, the superconducting wire having stable superconducting properties can be implemented.

DESCRIPTION OF EMBODIMENTS

Description of Embodiments of the Invention

Figure 1:
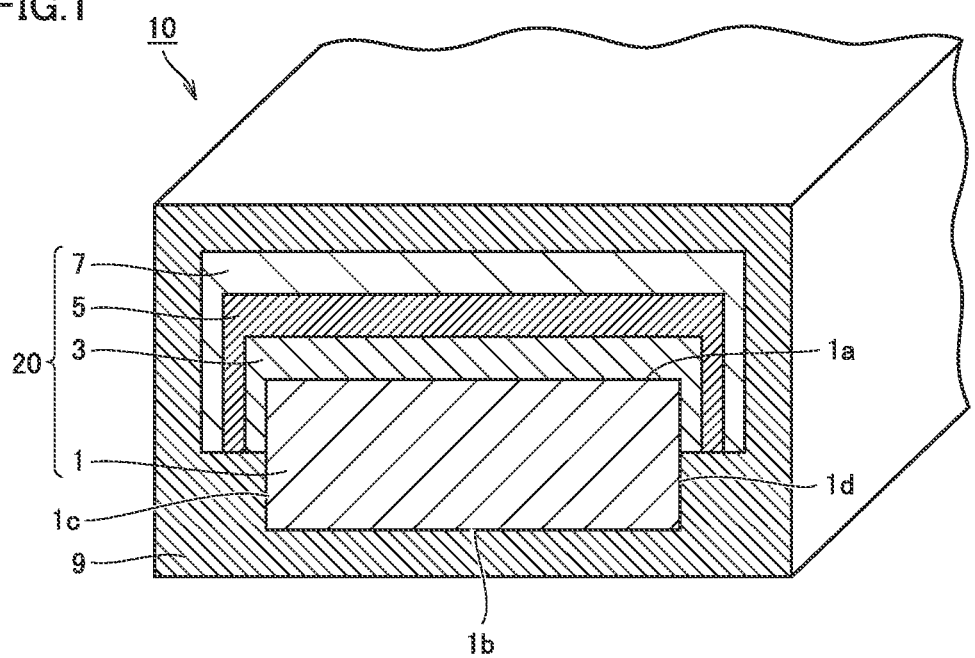
FIG. 1 is a schematic cross-sectional view showing a configuration of a superconducting wire in a first embodiment of the present invention.

Initially, aspects of the present invention will be described one by one.

(1) A superconducting wire according to an aspect of the present invention includes: a substrate having a first main surface and a second main surface opposite to the first main surface; and a superconducting material layer disposed on the first main surface of the substrate. The superconducting material layer is disposed to cover at least a part of a side surface of the substrate in a width direction of the substrate.

Regarding the conventional superconducting wire having the superconducting material layer disposed on only the first main surface of the substrate, a tensile stress is applied from the substrate to the superconducting material layer when cooled to the critical temperature, due to the fact that the thermal expansion coefficient of the substrate made of metal is larger than the thermal expansion coefficient of the superconducting material layer made of a ceramic material, and therefore, the ends, in the width direction, of the superconducting material layer may be peeled off. Accordingly, breakage, deformation, or the like is likely to occur to the superconducting material layer, resulting in a possibility of deterioration of the superconducting properties.

In the superconducting wire of above (1), the superconducting material layer is directly disposed on the first main surface of the substrate or indirectly disposed thereon with an intermediate layer disposed between the first main surface and the superconducting material layer. The superconducting material layer covers the first main surface and at least a part of the side surface of the substrate, and therefore, the strength of bonding between the substrate and the superconducting material layer at the ends in the width direction can be increased. Accordingly, the conformity of contraction of the ceramic layer to contraction of the substrate when cooled is improved. Therefore, the superconducting material layer can be prevented from peeling from the substrate. Consequently, breakage and deformation of the superconducting material layer can be prevented, and thus deterioration of the superconducting properties can be suppressed.

(2) Regarding the superconducting wire of above (1), preferably along at least a part of the superconducting wire in a direction in which the superconducting wire extends, the superconducting material layer is disposed to entirely cover the side surface of the substrate. Thus, the bonding area where the substrate is bonded to the superconducting material layer can be increased at the ends in the width direction, and therefore, the strength of bonding between the substrate and the superconducting material layer can further be increased. Accordingly, the conformity of contraction of the superconducting material layer to contraction of the substrate when cooled is improved, and thus peeling of the superconducting material layer from the substrate can reliably be prevented.

(3) Regarding the superconducting wire of above (1) or (2), preferably along at least a part of the superconducting wire in a direction in which the superconducting wire extends, the superconducting material layer is formed to cover the side surface of the substrate and extend onto at least a part of the second main surface. Thus, the bonding area where the substrate is bonded to the superconducting material layer can be increased at the ends in the width direction, and therefore, the strength of bonding between the substrate and the superconducting material layer can further be increased. Accordingly, the conformity of contraction of the superconducting material layer to contraction of the substrate when cooled is improved, and thus peeling of the superconducting material layer from the substrate can more reliably be prevented.

(4) Regarding the superconducting wire of any of above (1) to (3), preferably the first main surface of the substrate includes a curved portion. Thus, the surface area of the first main surface is increased as compared with the substrate having the flat main surface. Therefore, the bonding area at the interface between the substrate and the superconducting material layer can be increased. Accordingly, the strength of bonding at the interface between the substrate and the superconducting material layer can further be increased.

(5) Regarding the superconducting wire of above (4), preferably the curved portion is located at an end, in the width direction of the substrate, of the first main surface of the substrate. The ends in the width direction of the superconducting material layer are regions where peeling is likely to occur due to a tensile stress applied from the substrate when cooled. The ends of the substrate in the width direction can be curved to effectively increase the strength of bonding between the superconducting material layer and the substrate at the ends. Accordingly, peeling of the superconducting material layer from the substrate can more reliably be prevented.

(6) Regarding the superconducting wire of any of above (1) to (5), preferably the superconducting material layer located on the side surface of the substrate has a thickness of not less than 0.5 μm and not more than 5 μm. Thus, the conformity of contraction of the superconducting material layer to contraction of the substrate when cooled can be ensured, and therefore, breakage of the superconducting material layer can be prevented.

(7) Regarding the superconducting wire of any of above (1) to (6), preferably the superconducting wire further includes an intermediate layer disposed between the first main surface of the substrate and the superconducting material layer. The intermediate layer is disposed to cover at least a part of the side surface of the substrate. Thus, the orientation alignment of the superconducting material layer can also be improved on the side surfaces of the substrate. Moreover, the strength of bonding at the interface between the intermediate layer and the substrate can be increased, and therefore, peeling of the intermediate layer from the substrate can be prevented. Accordingly, breakage and deformation of the superconducting material layer can be suppressed.

(8) Regarding the superconducting wire of any of above (1) to (7), preferably the superconducting material layer is made of an oxide superconducting material. Thus, local peeling of the superconducting material layer can be prevented, and therefore, the superconducting wire having stable superconducting properties can be implemented.

Details of Embodiments of the Invention

Embodiments of the present invention will be described hereinafter based on the drawings. In the following draw- First Embodiment Configuration of Superconducting Wire FIG. 1 is a schematic cross-sectional view showing a configuration of a superconducting wire in a first embodiment of the present invention. FIG. 1 shows a cross section in the direction crossing the direction in which a superconducting wire 10 in the first embodiment extends. Therefore, the direction crossing the plane of the drawing is the longitudinal direction of the superconducting wire, and superconducting current in a superconducting material layer 5 is to flow in the direction crossing the plane of the drawing. Moreover, in the schematic cross-sectional views in FIG. 1 and subsequent drawings, the difference between the dimension in the top-bottom direction (hereinafter also referred to as "thickness direction") and the dimension in the left-right direction (hereinafter also referred to as "width direction") of the rectangular cross section is shown to be small for the sake of easy recognition of the drawings. However, actually the dimension in the thickness direction of the cross section is sufficiently smaller than the dimension in the width direction of the cross section.

Referring to FIG. 1, superconducting wire 10 in the first embodiment has a lengthy shape (tape shape) with a rectangular cross section, and the relatively larger surfaces of the wire extending in the longitudinal direction of the lengthy shape are herein defined as main surfaces. Superconducting wire 10 includes a substrate 1, an intermediate layer 3, a superconducting material layer 5, a protective layer 7, and a stabilizing layer 9.

Substrate 1 has a first main surface 1a and a second main surface 1b. Second main surface 1b is located opposite to first main surface 1a. Substrate 1 further has a first side surface 1c and a second side surface 1d opposite to first side surface 1c. Preferably, substrate 1 is made of a metal for example and has a lengthy shape (tape shape) with a rectangular cross section. For the superconducting wire to be wound in a coil shape, preferably substrate 1 extends for a long distance of approximately 2 km.

More preferably, an orientation-aligned metal substrate is used as substrate 1. The orientation-aligned metal substrate means a substrate in which crystal orientations are aligned in two axis directions in a plane of the substrate surface. For the orientation-aligned metal substrate, preferably an alloy of at least two metals selected from nickel (Ni), copper (Cu), chromium (Cr), manganese (Mn), cobalt (Co), iron (Fe), palladium (Pd), silver (Ag), and gold (Au), for example, is used. These metals and another metal or alloy may be stacked together. For example, an alloy such as SUS which is a high-strength material may also be used. The material for substrate 1 is not limited to the aforementioned ones, and any material other than the metal for example may be used.

Superconducting wire 10 has a dimension in the width direction of approximately 4 mm to 1.0 mm, for example. In order to increase the density of current flowing in superconducting wire 10, a smaller cross-sectional area of substrate is preferred. However, an excessively thin thickness (in the top-bottom direction in FIG. 1) of substrate 1 may result in deterioration of the strength of substrate 1. Therefore, the thickness of substrate 1 is preferably about 0.1 mm.

Intermediate layer 3 is formed on first main surface 1a of substrate 1. Superconducting material layer 5 is formed on the main surface (upper main surface in FIG. 1) of intermediate layer 3 opposite to the main surface thereof facing substrate 1. Namely, superconducting material layer 5 is disposed on first main surface 1a of substrate 1 with intermediate layer 3 between superconducting material layer 5 and substrate 1. The material forming intermediate layer 3 is preferably yttria-stabilized zirconia (YSZ), cerium oxide ($CeO_2$), magnesium oxide (MgO), yttrium oxide ($Y_2O_3$), and strontium titanate ($SrTiO_3$), for example. These materials have an extremely low reactivity with superconducting material layer 5 and do not deteriorate the superconducting properties of superconducting material layer 5 even at the boundary abutting on superconducting material layer 5. Particularly in the case where a metal is used as a material forming substrate 1, the intermediate layer can perform a function of alleviating difference in orientation alignment between superconducting material layer 5 and substrate 1 having crystal orientation alignment in its surface to thereby prevent metal atoms from escaping from substrate 1 into superconducting material layer 5 during formation of superconducting material layer 5 at a high temperature. The material forming intermediate layer 3 is not particularly limited to the aforementioned ones.

Intermediate layer 3 may be made up of a plurality of layers. In the case where intermediate layer 3 is made up of a plurality of layers, the layers constituting intermediate layer 3 may be formed of respective materials different from each other, or some of the layers constituting intermediate layer 3 may be made of the same material.

Superconducting material layer 5 is a thin-film layer in superconducting wire 10, and superconducting current flows in this superconducting material layer 5. While the superconducting material is not particularly limited, the superconducting material is preferably an RE-123-based oxide superconductor, for example. RE-123-based oxide superconductor means a superconductor represented by $REBa_2Cu_3O_y$, (y is 6 to 8, more preferably 6.8 to 7, and RE represents yttrium or rare-earth element such as Gd, Sm, Ho, or the like). In order to improve the magnitude of the superconducting current flowing in superconducting material layer 5, superconducting material layer 5 preferably has a thickness of 0.5 μm to 10 μm.

Protective layer 7 is formed on the main surface (upper main surface in FIG. 1) of superconducting material layer 5 opposite to the main surface thereof facing intermediate layer 3. Preferably, protective layer 7 is made for example of silver (Ag) or silver alloy, and has a thickness of not less than 0.1 μm and not more than 50 μm.

Above-described substrate 1, intermediate layer 3, superconducting material layer 5, and protective layer 7 constitute a multilayer stack 20. Stabilizing layer 9 is disposed to cover the periphery of multilayer stack 20. In the present embodiment, stabilizing layer 9 is disposed to cover the outer periphery of multilayer stack 20, namely cover substantially the whole outermost surface of multilayer stack 20. It should be noted that "periphery of the multilayer stack" of the present invention is not limited to the whole periphery and may be only a main surface of the multilayer stack.

Stabilizing layer 9 is formed of a highly conductive metal foil or plating layer, or the like. Stabilizing layer 9 functions as a bypass together with protective layer 7 for commutation of the current in superconducting material layer 5 when transition of superconducting material layer 5 from the superconducting state to the normal conducting state occurs. The material forming stabilizing layer 9 is preferably copper (Cu), or copper alloy or the like, for example. While the thickness of stabilizing layer 9 is not particularly limited, the thickness is preferably 10 µm to 500 µm for physically protecting protective layer 7 and superconducting material layer 5.

Figure 2:
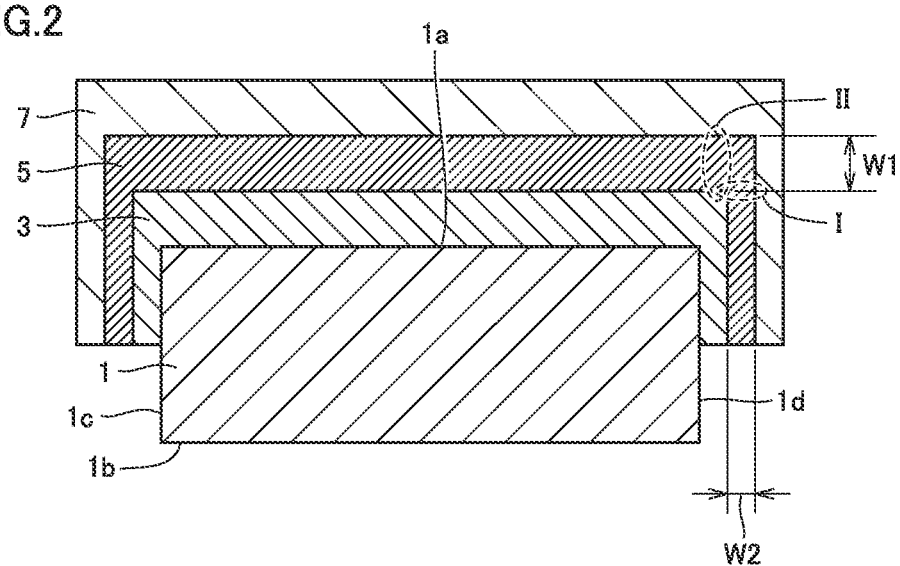
FIG. 2 is a schematic cross-sectional view showing a configuration of a multilayer stack in the first embodiment.

FIG. 2 is a schematic cross-sectional view showing a configuration of multilayer stack 20 in the first embodiment. FIG. 2 shows a cross section in the direction crossing the direction in which superconducting wire 10 in the first embodiment extends.

Referring to FIG. 2, intermediate layer 3, superconducting material layer 5, and protective layer 7 in multilayer stack 20 are disposed to cover at least a part of a side surface of substrate 1 in the width direction of substrate 1 (left-right direction in FIG. 2). In the present embodiment, intermediate layer 3, superconducting material layer 5, and protective layer 7 are disposed to cover the whole of first main surface 1a of substrate 1 and cover a part of each of first side surface 1c and second side surface 1d of substrate 1.

This configuration enables increase of the bonding area at the interface between metal substrate 1 and a ceramic layer constituted of intermediate layer 3 and superconducting material layer 5, as compared with the conventional superconducting wire in which intermediate layer 3, superconducting material layer 5, and protective layer 7 cover only first main surface 1a of substrate 1. Accordingly, the bonding strength at the interface between substrate 1 and the ceramic layer can be increased.

When the superconducting wire in which the ceramic layer is formed on the metal substrate is cooled to the critical temperature, a stress is generated between the metal substrate and the ceramic layer due to the fact that the thermal expansion coefficient of the metal substrate is larger than the thermal expansion coefficient of the ceramic layer. Specifically, when the superconducting wire is cooled, each layer in the wire contracts. At this time, due to the fact that the superconducting material layer and the intermediate layer are each a ceramic layer and smaller in thermal expansion coefficient than the metal substrate, contraction of the ceramic layer does not conform to contraction of the metal substrate and thus a compressive stress is applied to the ceramic layer. Consequently, the superconducting material layer and/or the intermediate layer peel off particularly at ends, in the width direction, of the superconducting material layer and the intermediate layer. Thus, breakage, deformation, or the like is likely to occur to the superconducting material layer, resulting in a possibility of deterioration of the superconducting properties.

In superconducting wire 10 in the first embodiment, the ceramic layer constituted of superconducting material layer 5 and intermediate layer 3 covers at least a part of each side surface of substrate 1, and therefore, the strength of bonding between substrate 1 and the ceramic layer at the ends in the width direction can be increased. Accordingly, the conformity of the contraction of the ceramic layer to the contraction of substrate 1 when cooled is improved, and therefore, superconducting material layer 5 and intermediate layer 3 can be prevented from peeling off from substrate 1. Consequently, breakage and deformation of superconducting material layer 5 can be prevented and thus deterioration of the superconducting properties can be suppressed.

Superconducting material layer 5 located above main surface 1a of substrate 1 has a thickness W1 and superconducting material layer 5 located above side surfaces 1c, 1d of substrate 1 has a thickness W2. Preferably thickness W2 is equal to or less than thickness W1 (W2<W1). If thickness W2 is larger than thickness W1, the conformity of the contraction of superconducting material layer 5 located on side surfaces 1c, 1d of substrate 1 to the contraction of substrate 1 is likely to be insufficient when superconducting wire 10 is cooled, resulting in a large tensile stress applied from substrate 1 to superconducting material layer 5. Consequently, at the boundary (corresponding to region II in FIG. 2) between superconducting material layer 5 located above first main surface 1a of substrate 1 and superconducting material layer 5 located above the side surface, superconducting material layer 5 can be broken. On the contrary, if thickness W2 is extremely smaller than thickness W1, the strength of superconducting material layer 5 located above side surfaces 1c, 1d of substrate 1 is considerably smaller than the strength of superconducting material layer 5 located above first main surface 1a of substrate. Therefore, at the bottom (corresponding to region I in FIG. 2) of superconducting material layer 5 located above side surfaces 1c, 1d of substrate 1, superconducting material layer 5 can be broken. In order to prevent such breakage of superconducting material layer 5, preferably thickness W2 is not less than 0.5 µm and not more than 5 on the condition that thickness W1 is 0.5 µm to 10 µm, for example.

Moreover, in the first embodiment, intermediate layer 3 and superconducting material layer 5 located on the side surfaces of substrate 1 may be formed either both or one of first side surface 1c and second side surface 1d of substrate 1. In other words, intermediate layer 3 and superconducting material layer 5 may be disposed to cover at least one of first side surface 1c and second side surface 1d. This configuration enables increase of the bonding area at the interface between substrate 1 and the ceramic layer, as compared with the conventional superconducting wire, and therefore enables increase of the bonding strength at the interface.

Method of Manufacturing Superconducting Wire

Next, referring to FIGS. 3 to 8, a method of manufacturing a superconducting wire in the first embodiment will be described. In the following, the present embodiment will be specifically described in connection with a method of manufacturing a superconducting wire 10 using a multilayer stack 20 which is fabricated to have a width of 30 mm and subjected to wire thinning to thereby have a width of 4 mm, by way of example.

Figure 3:
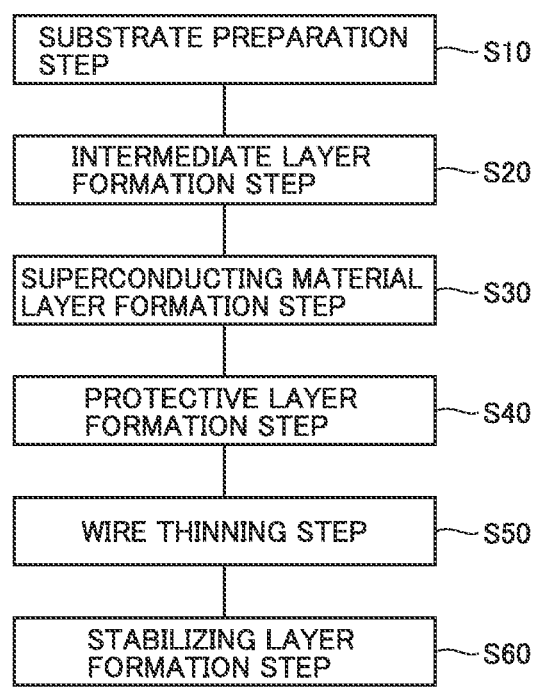
FIG. 3 is a flowchart showing a method of manufacturing a superconducting wire in the first embodiment.
Figure 4:
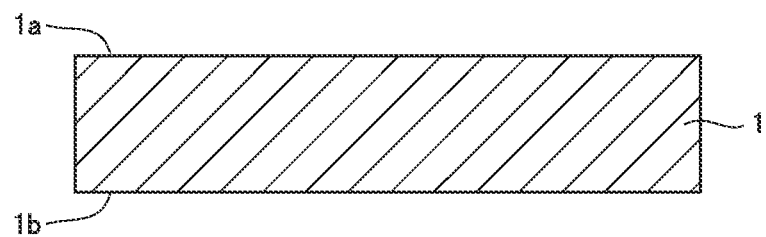
FIG. 4 is a schematic cross-sectional view for illustrating the method of manufacturing a superconducting wire in the first embodiment.
Figure 5:
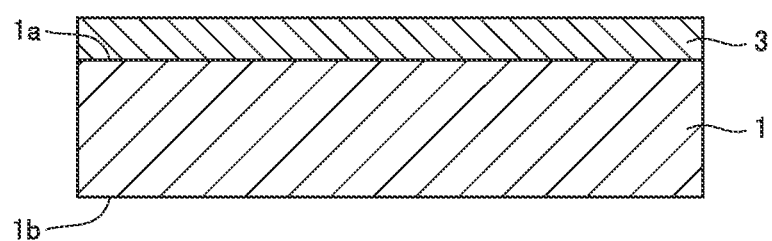
FIG. 5 is a schematic cross-sectional view for illustrating the method of manufacturing a superconducting wire in the first embodiment.
Figure 6:
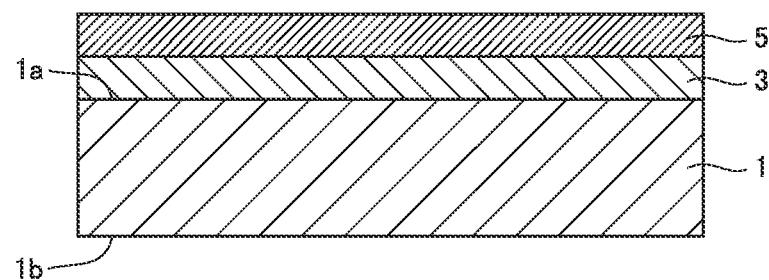
FIG. 6 is a schematic cross-sectional view for illustrating the method of manufacturing a superconducting wire in the first embodiment.
Figure 7:
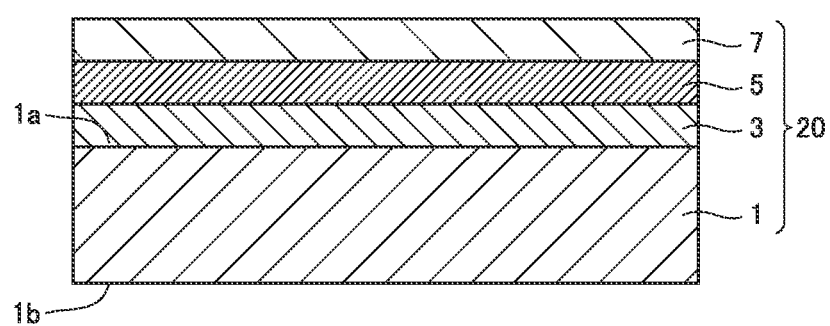
FIG. 7 is a schematic cross-sectional view for illustrating the method of manufacturing a superconducting wire in the first embodiment.

FIG. 3 is a flowchart showing a method of manufacturing a superconducting wire in the first embodiment. Referring to FIG. 3, initially a substrate preparation step (S10) is performed. Specifically, referring to FIG. 4, a substrate 1 formed of an orientation-aligned metal substrate and having a tape shape with a width of 30 mm is prepared. Substrate 1 has a first main surface 1a and a second main surface 1b located opposite to first main surface 1a. The thickness of substrate 1 may be adjusted appropriately to meet any purpose, and can be usually in a range of 10 µm to 500 µm. For example, the thickness of substrate 1 is approximately 100 µm.

Next, an intermediate layer formation step (S20 in FIG. 3) of forming an intermediate layer 3 on substrate 1 is performed. Specifically, referring to FIG. 5, intermediate layer 3 is formed on first main surface 1a of substrate 1. As the method of forming intermediate layer 3, any method may be used. For example, a physical vapor deposition method such as pulsed laser deposition (PLD) method may be used.

Next, a superconducting material layer formation step (S30 in FIG. 3) of forming a superconducting material layer 5 on intermediate layer 3 is performed. Specifically, referring to FIG. 6, superconducting material layer 5 made of an RE-123-based oxide superconductor is formed on the main surface (upper main surface in FIG. 6) of intermediate layer 3 opposite to the main surface thereof facing substrate 1. As the method of forming superconducting material layer 5, any method may be used. For example, a vapor phase method, a liquid phase method, or a combination of them may be used to form the layer. Examples of the vapor phase method are laser vapor deposition method, sputtering method, electron beam vapor deposition method, and the like. This step can be performed by at least one of laser vapor deposition method, sputtering method, electron beam method, and organic metal deposition method to form superconducting material layer 5 having its surface which is excellent in crystal orientation alignment and surface smoothness.

Next, a protective layer formation step (S40 in FIG. 3) of forming a protective layer 7 on superconducting material layer 5 is performed. Specifically, referring to FIG. 7, protective layer 7 made of silver (Ag) or silver alloy is formed on the main surface (upper main surface in FIG. 7) of superconducting material layer 5 opposite to the main surface thereof facing intermediate layer 3, by a physical vapor deposition method such as sputtering, electroplating method, or the like, for example. Protective layer 7 can be formed to protect the surface of superconducting material layer 5. After this, oxygen annealing, namely heating in an oxygen ambient (oxygen introduction step) is performed to introduce oxygen into superconducting material layer 5. Through the above-described steps, a multilayer stack 20 having a dimension in the width direction of approximately 30 mm is formed.

Figure 8:
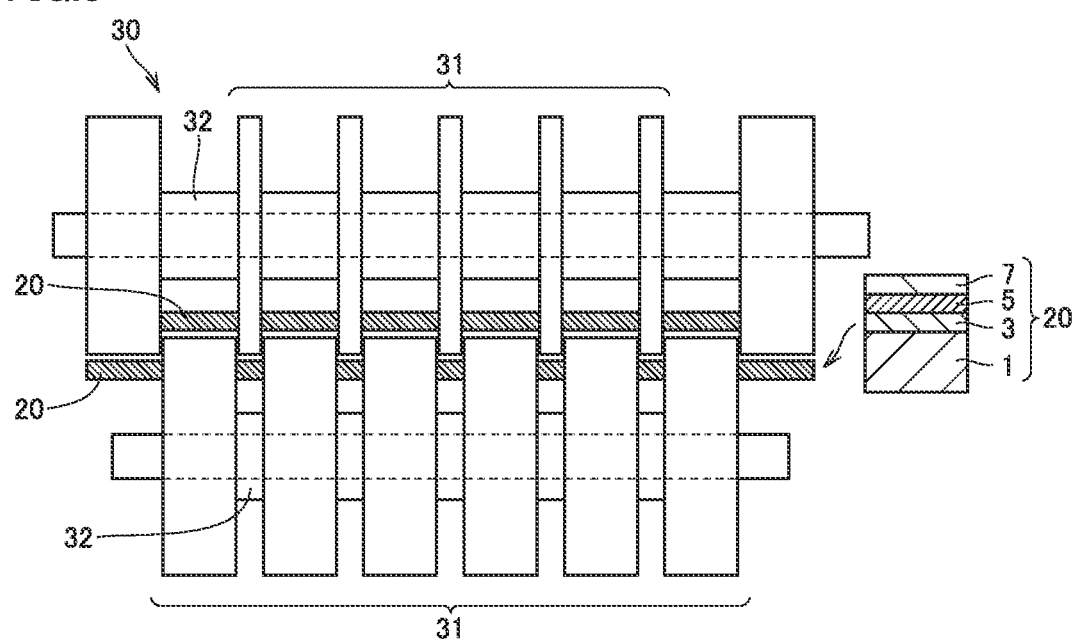
FIG. 8 is a diagram schematically showing a configuration of a slitter used for a wire thinning step.

Next, a wire thinning step (S50 in FIG. 3) of cutting multilayer stack 20 of 30 mm in width into those each having a predetermined width (4 mm for example) is performed. Specifically, as shown in FIG. 8, mechanical slitting, namely mechanical cutting of multilayer stack 20 of 30 mm in width with rotary blades, is performed to produce, from multilayer stack 20, thinned wires each having a width of 4 mm. FIG. 8 schematically shows a configuration of a slitter 30 used for the wire thinning step. At the right side in FIG. 8, the configuration of multilayer stack 20 undergoing slitting by slitter 30 is shown. In multilayer stack 20, intermediate layer 3, superconducting material layer 5, and protective layer 7 are superposed in this order on substrate 1.

Referring to FIG. 8, slitter 30 includes a plurality of rotary blades 31 and a plurality of spacers 32. In the present embodiment, slitter 30 includes 11 rotary blades 31 in total, for example. On an upper rotational shaft of slitter 30, five narrower rotary blades 31 each having a width of about 1 mm are arranged. Between rotary blades 31 adjacent to each other in the direction of the rotational axis, spacer 32 is disposed. Meanwhile, on a lower rotational shaft of slitter 30, six wider rotary blades 31 each having a width of about 4 mm are arranged. With rotary blades 31 arranged in this way, wider rotary blades 31 are applied to multilayer stack 20 from the substrate 1 side, and wider rotary blades 31 are applied to multilayer stack 20 from the protective layer 7 side. Accordingly, six thin wires in total each having a width of 4 mm can be obtained.

Figure 9:
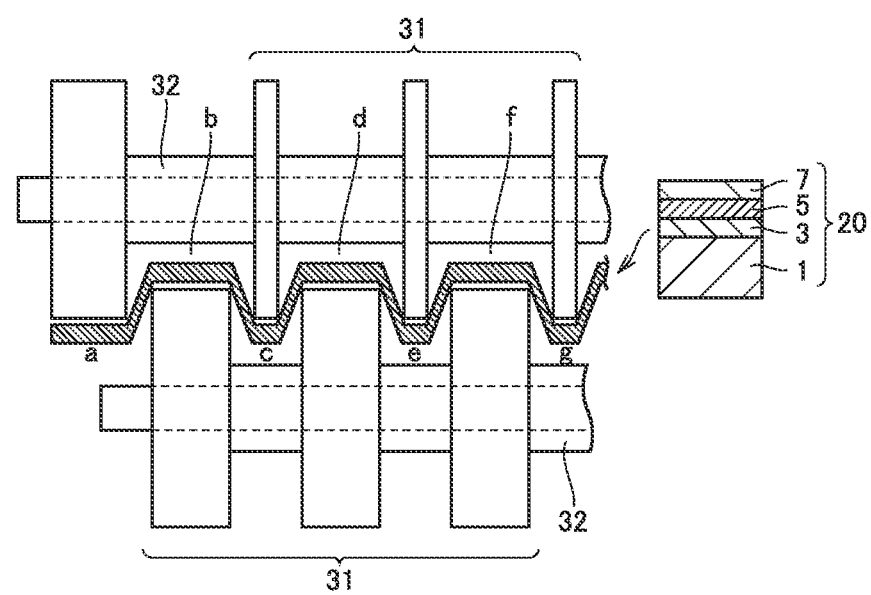
FIG. 9 is a schematic diagram for illustrating mechanical slitting with the slitter shown in FIG. 8.

FIG. 9 is a schematic diagram for illustrating mechanical slitting with slitter 30 shown in FIG. 8. At the right side in FIG. 9, the configuration of multilayer stack 20 undergoing slitting by slitter 30 is shown. In multilayer stack 20, intermediate layer 3, superconducting material layer 5, and protective layer 7 are superposed in this order on substrate 1.

Referring to FIG. 9, the mechanical slitting of multilayer stack 20 with protective layer 7 facing upward produces thin wires a to g. Although the gaps between rotary blades for actual mechanical slitting are invisibly fine, the gaps in FIG. 9 are shown to be larger for emphasis for the sake of facilitating understanding.

The mechanical slitting is cutting through shearing by means of upper rotary blades 31 and opposite lower rotary blades 31. Specifically, upper rotary blades 31 provide slitting from the protective layer 7 side to form thin wires c, e, g, while lower rotary blades 31 provide slitting from the substrate 1 side to form thin wires b, d, f. Further, a thin wire a is formed at an end in the direction of the rotational axis of slitter 30.

For each of obtained thin wires a to g, edges are curved depending on the direction in which rotary blade 31 is applied (direction of slitting). Specifically, regarding thin wires c, e, g produced by slitting from the protective layer 7 side with upper rotary blades 31, substrate 1 is curved at the edges toward protective layer 7. In contrast, regarding thin wires b, d, f produced by slitting from the substrate 1 side with lower rotary blades 31, protective layer 7 and the ceramic layer are curved at the edges toward substrate 1.

Figure 10:
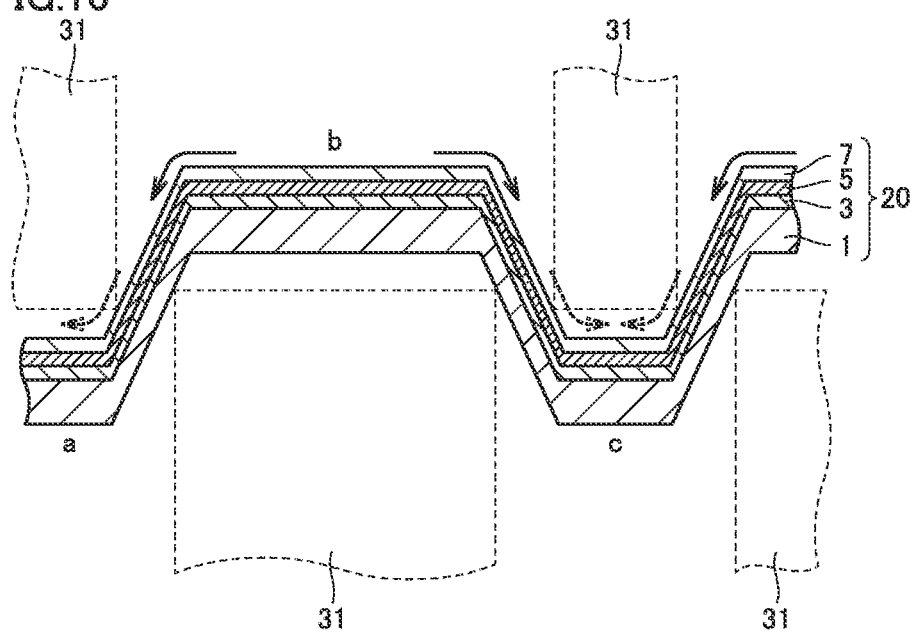
FIG. 10 is a schematic diagram showing respective configurations of a thin wire b and a thin wire c obtained through the mechanical slitting in FIG. 9.

FIG. 10 is a schematic diagram showing respective configurations of thin wire b and thin wire c obtained through the mechanical slitting shown in FIG. 9. Referring to FIG. 10, in the case of slitting with upper rotary blades 31 applied from the protective layer 7 side toward substrate 1, edges of thin wire c are curved toward protective layer 7. In this case, protective layer 7 and the ceramic layer are compressed in the width direction as indicated by the arrows represented by broken lines in FIG. 10. In contrast, in the case of slitting with lower rotary blades 31 applied from the substrate 1 side toward protective layer 7, edges of thin wire b are curved toward substrate 1. In this case, the edges of protective layer 7 and the ceramic layer are stretched toward substrate 1 as indicated by the arrows represented by the solid lines in FIG. 10. Regarding thin wire b, the edge of the ceramic layer and the protective layer stretched toward substrate 1 overlaps at least a part of the side surface of substrate 1. Accordingly, multilayer stack 20 as shown in FIG. 2 is formed.

Figure 11:
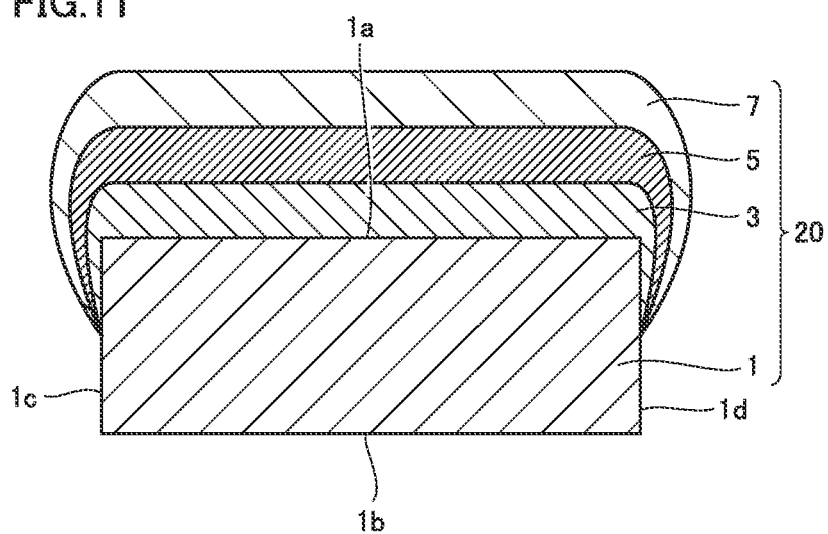
FIG. 11 is a schematic cross-sectional view showing a configuration of a multilayer stack after the wire thinning step.

Regarding each of thin wires b, d, f, actually the edges of the ceramic layer and the protective layer that cover upper portions of the side surfaces of substrate 1 gradually decrease in thickness in the direction from first main surface $1a$ to second main surface $1b$ of substrate 1 as shown in FIG. 11. The thickness of the ceramic layer and protective layer 7 covering the upper portions of the side surfaces of substrate 1 can be varied by adjusting the gap between upper rotary blade 31 and opposite lower rotary blade 31 of slitter 30 or adjusting overlapping of upper rotary blades 31 and opposite lower rotary blades 31 as seen in the direction of the rotational axis, for example.

In the first embodiment, as shown in FIG. 8, the mechanical slitting uses rotary blades 31 having a predetermined wire width (4 mm for example) as rotary blades 31 which are to be applied from the substrate 1 side, and also uses narrower rotary blades 31 as rotary blades 31 which are to be applied from the protective layer 7 side. In this way, the number of thin wires (thin wires b, d, f in FIG. 9) obtained through slitting from the substrate 1 side can be increased.

Figure 12:
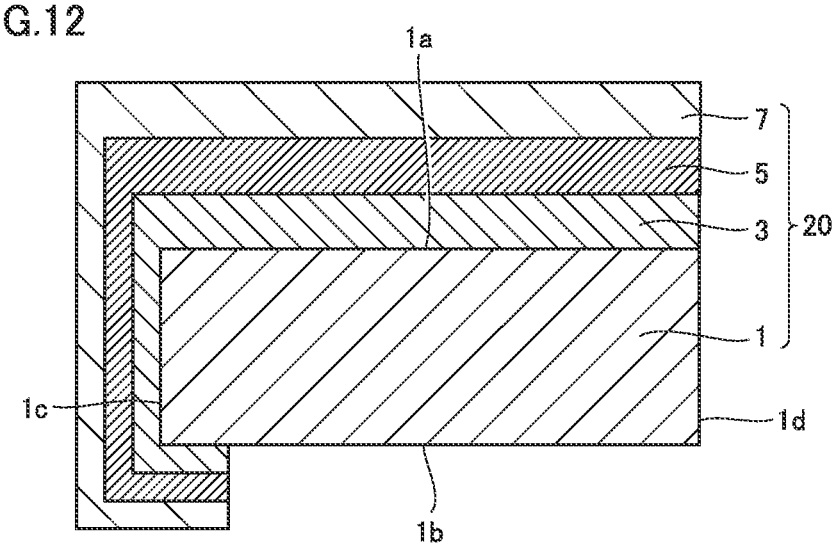
FIG. 12 is a schematic cross-sectional view showing a configuration of a thin wire a in FIG. 9.

FIG. 12 is a schematic cross-sectional view showing a configuration of thin wire a in FIG. 9. Thin wire a is a thin wire formed at an end in the direction of the rotational axis of slitter 30. Referring to FIG. 12, in multilayer stack 20, intermediate layer 3, superconducting material layer 5, and protective layer 7 are disposed to entirely cover first main surface $1a$ of substrate 1 and cover first side surface $1c$ of substrate 1. It should be noted that intermediate layer 3, superconducting material layer 5, and protective layer 7 are formed to cover first side surface 1c of substrate 1 and extend onto at least a part of second main surface 1b. This is for the following reason. In the intermediate layer formation step, the superconducting material layer formation step, and the protective layer formation step (S20, S30, S40 in FIG. 3), intermediate layer 3, superconducting material layer 5, and protective layer 7 are formed in order on first main surface 1a of substrate 1 and these layers are also formed on side surfaces 1c, 1d in addition to first main surface 1a.

This configuration enables increase of the bonding area at the interface between substrate 1 and the ceramic layer of thin wire a like thin wires b, d, f (FIG. 9), and therefore, the bonding strength at the interface can be increased. Accordingly, the conformity of contraction of the ceramic layer to the contraction of substrate 1 when cooled is improved, and thus superconducting material layer 5 and intermediate layer 3 can be prevented from peeling off from substrate 1.

Referring again to FIG. 3, finally a stabilizing layer formation step (S60 in FIG. 3) of forming a stabilizing layer 9 on the periphery of multilayer stack 20 having undergone the wire thinning is performed. Specifically, stabilizing layer 9 made of copper (Cu) or copper alloy is formed through the known plating to cover the outer periphery of multilayer stack 20, namely to cover substantially the whole outermost surface of multilayer stack 20. The method of forming stabilizing layer 9 may be bonding of copper foil other than the plating. Through the above-described steps, superconducting wire 10 in the first embodiment shown in FIG. 1 is manufactured.

Second Embodiment

Figure 13:
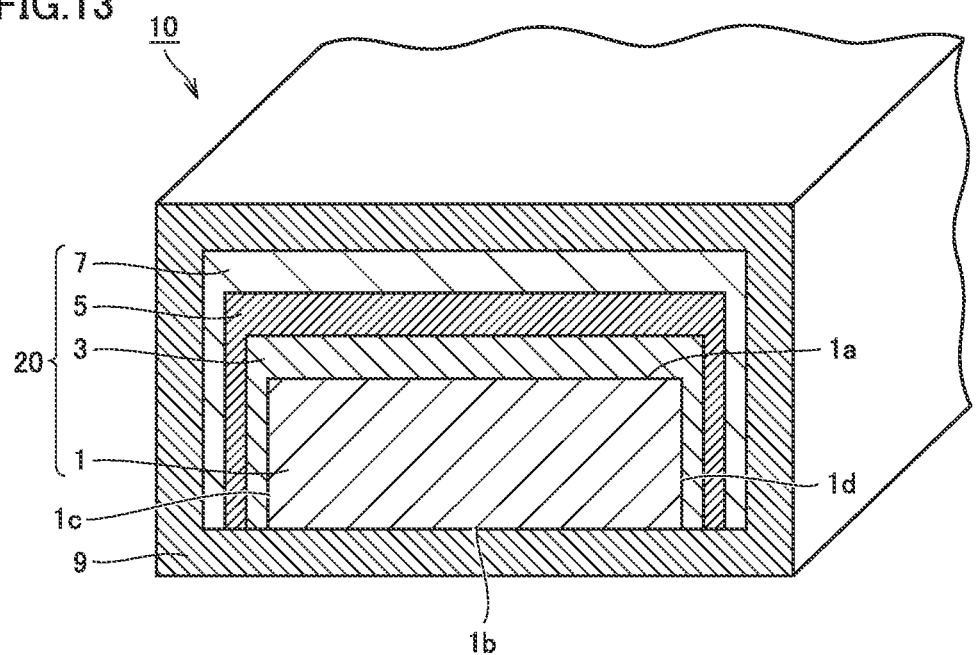
FIG. 13 is a schematic cross-sectional view showing a configuration of a superconducting wire in a second embodiment of the present invention.

FIG. 13 is a schematic cross-sectional view showing a configuration of a superconducting wire 10 in a second embodiment of the present invention. FIG. 13 shows a cross section in the direction crossing the direction in which superconducting wire 10 in the second embodiment extends.

Referring to FIG. 13, superconducting wire 10 in the second embodiment has a configuration which is basically similar to that of superconducting wire 10 in the first embodiment as described above. However, superconducting wire 10 in the second embodiment differs from superconducting wire 10 in the first embodiment in that intermediate layer 3, superconducting material layer 5, and protective layer 7 are disposed to entirely cover side surfaces 1c, 1d of substrate 1 in the second embodiment.

In the second embodiment, the ceramic layer made up of superconducting material layer 5 and intermediate layer 3 entirely covers the side surface of substrate 1, and therefore, the strength of bonding between substrate 1 and the ceramic layer at the end in the width direction can further be increased. Accordingly, the conformity of contraction of the ceramic layer to contraction of substrate 1 when cooled is improved. Therefore, peeling of superconducting material layer 5 and intermediate layer 3 from substrate 1 can reliably be prevented. Consequently, breakage and deformation of superconducting material layer 5 can be prevented and thus deterioration of the superconducting properties can be suppressed. As long as the ceramic layer entirely covers the side surfaces of substrate 1 along at least a part of superconducting wire 10 in the longitudinal direction, the strength of bonding between substrate 1 and the ceramic layer can be increased.

The method of manufacturing the superconducting wire in the second embodiment is basically similar to the method of manufacturing the superconducting wire in the first embodiment which is described above with reference to FIGS. 3 to 8. However, the second embodiment differs from the first embodiment in terms of the conditions for the mechanical slitting in the wire thinning step (S50 in FIG. 3, FIG. 8). Specifically, in slitter 30 (FIG. 8), at least one of the gap between upper rotary blade 31 and opposite lower rotary blade 31, overlapping of upper rotary blades 31 and lower rotary blades 31 as seen in the direction of the rotational axis, and the rotational speed of rotary blades 31 differs from the first embodiment. For example, in the second embodiment, the gap between upper rotary blade 31 and opposite lower rotary blade 31 can be made larger than that of the first embodiment to increase the area of the ceramic layer covering the side surfaces of substrate 1. Thus, the conditions for the wire thinning step can be used to adjust the shape of the ceramic layer covering the side surfaces of substrate 1.

Third Embodiment

Figure 14:
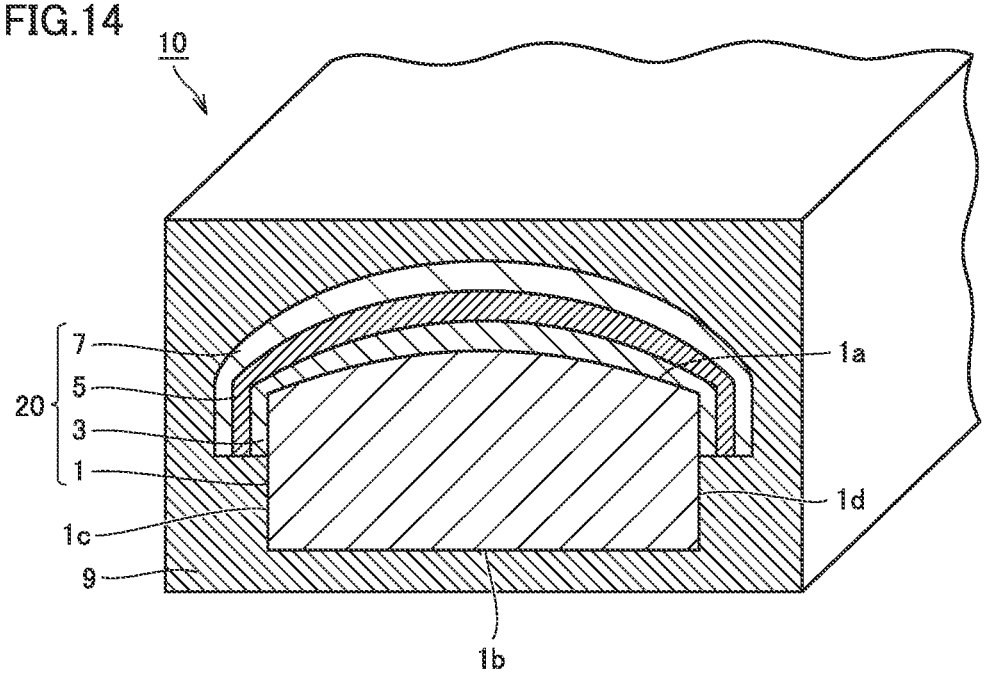
FIG. 14 is a schematic cross-sectional view showing a configuration of a superconducting wire in a third embodiment of the present invention.

FIG. 14 is a schematic cross-sectional view showing a configuration of a superconducting wire in a third embodiment of the present invention. FIG. 14 shows a cross section in the direction crossing the direction in which a superconducting wire in the third embodiment extends.

Referring to FIG. 14, superconducting wire 10 in the third embodiment has a configuration which is basically similar to that of superconducting wire 10 in the first embodiment as described above. However, superconducting wire 10 in the third embodiment differs from superconducting wire 10 in the first embodiment in that first main surface 1a of substrate 1 includes a curved portion. The curved portion has a convex shape which is curved toward intermediate layer 3, and first main surface 1a is entirely curved as shown in FIG. 14, for example.

In the third embodiment, first main surface 1a of substrate 1 has a curved portion, and therefore, the surface area of first main surface 1a can be increased as compared with substrate 1 having flat first main surface 1a. Moreover, the ceramic layer made up of intermediate layer 3 and superconducting material layer 5 is formed to entirely cover first main surface 1a having the curved portion, and therefore, the bonding area at the interface between substrate 1 and the ceramic layer can be increased. Thus, the bonding strength at the interface between substrate 1 and the ceramic layer can further be increased. Accordingly, even when a tensile stress is applied from substrate 1 when superconducting wire 10 is cooled, superconducting material layer 5 and intermediate layer 3 can reliably be prevented from peeling off from substrate 1.

As to the curved portion, first main surface 1a may entirely be curved as shown in FIG. 14, or first main surface 1a may partially be curved. Moreover, the curved portion may be a convex shape which is curved toward intermediate layer 3, or a concave shape which is curved toward second main surface 1b.

Figure 15:
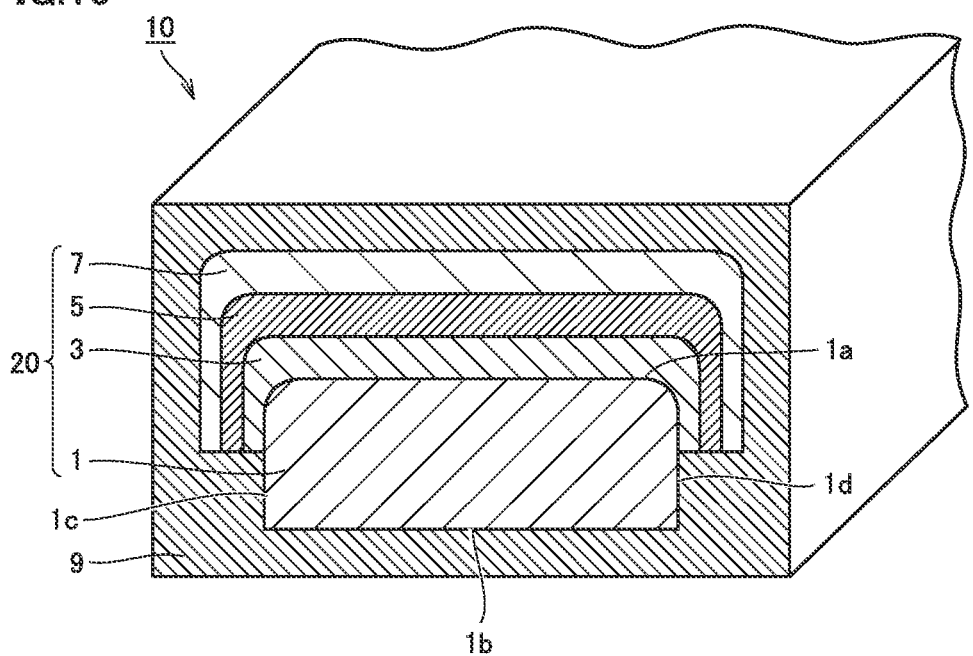
FIG. 15 is a schematic cross-sectional view showing another configuration of the superconducting wire in the third embodiment.

Further, in the third embodiment as shown in FIG. 15, preferably first main surface 1a of substrate 1 is curved at the ends in the width direction of substrate 1. The ends of the ceramic layer in the width direction are regions which are likely to peel off due to a tensile stress applied from substrate 1. The ends in the width direction of substrate 1 can be curved to effectively increase the strength of bonding between substrate 1 and the ceramic layer at the ends in the width direction. Accordingly, peeling of superconducting material layer 5 and intermediate layer 3 from substrate 1 can more reliably be prevented.

Stabilizing layer 9 covering the periphery of multilayer stack 20 is illustrated in FIGS. 14 and 15 as forming a rectangular cross section perpendicular to the longitudinal direction of superconducting wire 10. However, the cross-sectional shape of stabilizing layer 9 may be any shape other than the rectangular shape. For example, the cross-sectional shape of stabilizing layer 9 may be a convex shape conforming to the cross-sectional shape of multilayer stack 20.

The method of manufacturing the superconducting wire in the third embodiment is basically similar to the method of manufacturing the superconducting wire in the first embodiment which is described above with reference to FIGS. 3 to 8. However, the third embodiment differs from the first embodiment in terms of the conditions for the mechanical slitting in the wire thinning step (S50 in FIG. 3, FIG. 8). Specifically, as shown in FIGS. 9 and 10, in the case of slitting with lower rotary blade 31 applied from the substrate 1 side toward protective layer 7, the edges of the thin wire are curved toward substrate 1. At this time, the edges of substrate 1 are stretched toward the substrate 1 side, together with the edges of protective layer 7 and the ceramic layer. Accordingly, a curved portion of first main surface $1a$ of substrate 1 is formed in a convex shape which is curved toward intermediate layer 3 as shown in FIG. 14. The radius of curvature of the convex shape can be adjusted by adjusting the conditions for mechanical slitting (such as the gap between upper rotary blade 31 and opposite lower rotary blade 31, overlapping of upper blades 31 and lower blades, and the rotational speed of rotary blades 31).

Alternatively, in the method of manufacturing the superconducting wire in the third embodiment, substrate 1 having a curved portion of first main surface $1a$ may be formed and thereafter intermediate layer 3, superconducting material layer 5, and protective layer 7 may be superposed in order on this substrate 1, unlike the method of manufacturing the superconducting wire in the first embodiment.

Figure 16:
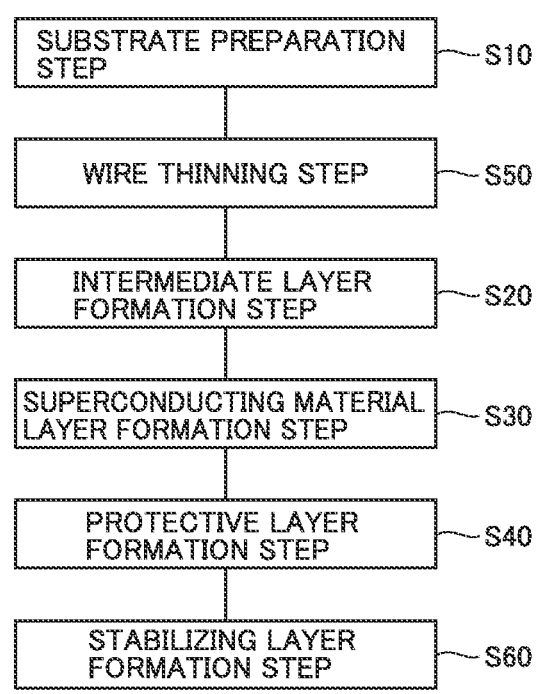
FIG. 16 is a flowchart showing another example of the method of manufacturing a superconducting wire in the third embodiment.

FIG. 16 is a flowchart showing another example of the method of manufacturing a superconducting wire in the third embodiment. In the following, the present embodiment will be specifically described in connection with a method of manufacturing a superconducting wire 10 using a substrate 1 having undergone the wire thinning to have a width of 4 mm, by way of example.

Referring to FIG. 16, initially a substrate preparation step (S10) is performed. Specifically, a substrate 1 formed of an orientation-aligned metal substrate and having a tape shape with a wide width (about 12 mm to 40 mm) is prepared. The thickness of substrate 1 may be adjusted appropriately to meet any purpose, and can be usually in a range of 10 μm to 500 μm. For example, the thickness of substrate 1 is approximately 100 μm.

Figure 17:
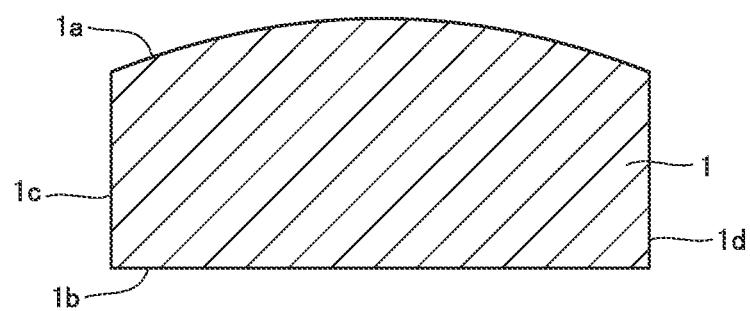
FIG. 17 is a schematic cross-sectional view showing a configuration of a substrate after wire thinning by mechanical slitting.

Next, a wire thinning step (S50 in FIG. 16) of cutting wide substrate 1 into those each having a predetermined width (4 mm for example) is performed. Specifically, mechanical slitting, namely mechanical cutting of wide substrate 1 with rotary blades, is performed to produce thin wires of 4 mm in width from substrate 1. This mechanical slitting by means of slitter 30 shown in FIG. 8 can be performed to form a curved portion of first main surface $1a$ of substrate 1 as shown in FIG. 17.

Specifically, the mechanical slitting causes edges of the thin wire to curve toward first main surface $1a$ or second main surface $1b$ depending on the direction in which the rotary blade is applied to substrate 1 (direction of slitting). For example, in the case of slitting with the rotary blade applied in the direction from second main surface $1b$ to first main surface $1a$, the edges of substrate 1 are curved toward second main surface $1b$. On the contrary, in the case of slitting with the rotary blade applied in the direction from first main surface $1a$ to second main surface $1b$, the edges of substrate 1 are curved toward first main surface $1a$. FIG. 17 is a schematic cross-sectional view showing a configuration of substrate 1 after wire thinning by mechanical slitting. Substrate 1 shown in FIG. 17 is obtained by slitting with the rotary blade applied in the direction from second main surface $1b$ to first main surface $1a$.

Referring back to FIG. 16, on substrate 1 having undergone the wire thinning, an intermediate layer formation step (S20), a superconducting material layer formation step (S30), and a protective layer formation step (S40) are subsequently performed in this order. The intermediate layer formation step, the superconducting material layer formation step, and the protective layer formation step are performed similarly to the corresponding steps in the first embodiment. Namely, intermediate layer 3, superconducting material layer 5, and protective layer 7 are formed to entirely cover first main surface $1a$ including the curved portion and at least partially cover side surfaces $1c$, $1d$. Finally, a stabilizing layer formation step (S60) is performed to form stabilizing layer 9 on the periphery of multilayer stack 20, and thus superconducting wire 10 in the third embodiment shown in FIG. 14 is completed.

In the third embodiment, after wide substrate 1 is cut into those each having a desired width in the wire thinning step (S50 in FIG. 16), the cut substrate 1 may be processed to have a curved portion of first main surface $1a$.

Fourth Embodiment

Figure 18:
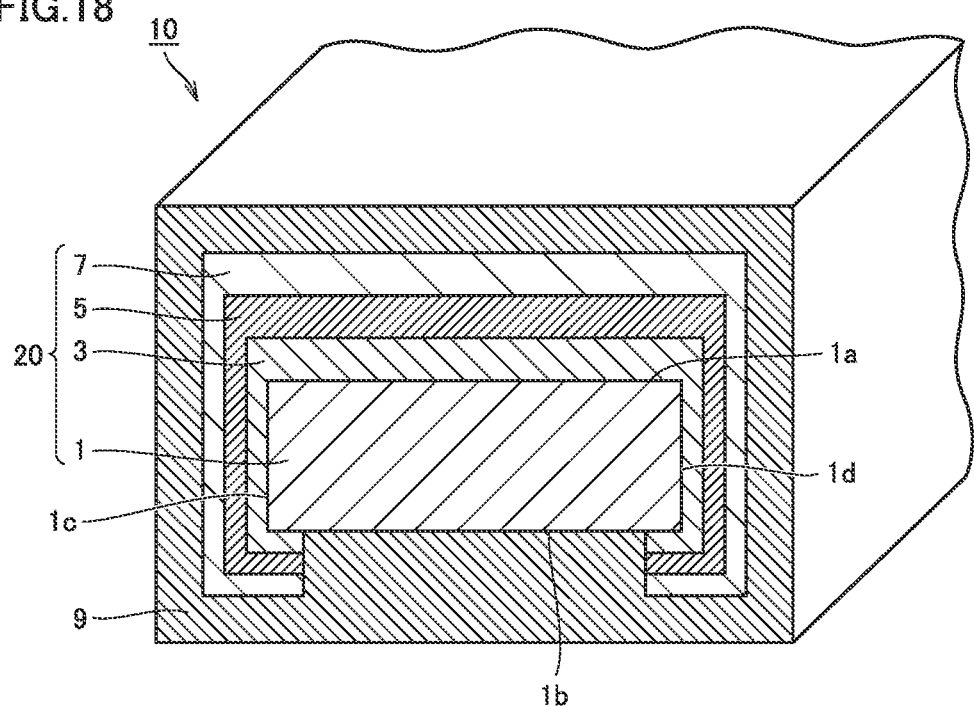
FIG. 18 is a schematic cross-sectional view showing a configuration of a superconducting wire in a fourth embodiment of the present invention.

FIG. 18 is a schematic cross-sectional view showing a configuration of a superconducting wire in a fourth embodiment of the present invention. FIG. 18 shows a cross section in the direction crossing the direction in which a superconducting wire in the fourth embodiment extends.

Referring to FIG. 18, superconducting wire 10 in the fourth embodiment has a configuration which is basically similar to that of superconducting wire 10 in the first embodiment as described above. However, superconducting wire 10 in the fourth embodiment differs from superconducting wire 10 in the first embodiment in that intermediate layer 3, superconducting material layer 5, and protective layer 7 are formed to cover each of side surfaces $1c$, $1d$ of substrate 1 and extend onto at least a part of second main surface $1b$.

In the fourth embodiment, the ceramic layer made up of superconducting material layer 5 and intermediate layer 3 entirely covers the side surfaces of substrate 1 and at least partially covers second main surface $1b$. Therefore, the strength of bonding between substrate 1 and the ceramic layer at the ends in the width direction can further be increased. Accordingly, the conformity of contraction of the ceramic layer to contraction of substrate 1 when cooled is improved. Therefore, peeling of superconducting material layer 5 and intermediate layer 3 from substrate 1 can reliably be prevented. Consequently, breakage and deformation of superconducting material layer 5 can be prevented and thus deterioration of the superconducting properties can be suppressed. As long as the ceramic layer at least partially covers second main surface $1b$ of substrate 1 along at least a part of superconducting wire 10 in the longitudinal direction, the strength of bonding between substrate 1 and the ceramic layer can be increased.

Figure 19:
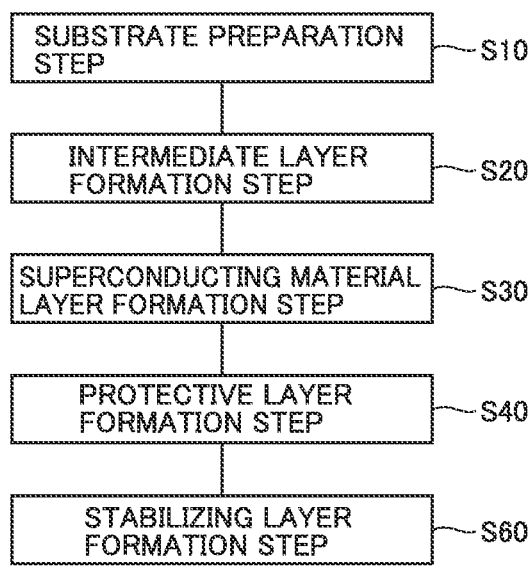
FIG. 19 is a flowchart showing a method of manufacturing a superconducting wire in the fourth embodiment.

The method of manufacturing superconducting wire 10 in the fourth embodiment is basically similar to the above-described method of manufacturing the superconducting wire in the first embodiment. However, the fourth embodiment differs from the first embodiment in that the former does not include the wire thinning step. FIG. 19 is a flowchart showing a method of manufacturing a superconducting wire in the fourth embodiment. Referring to FIG. 19, initially a substrate preparation step (S10) is performed. Specifically, a substrate 1 formed of an orientation-aligned metal substrate and having a tape shape with a desired width (4 mm for example) is prepared. As shown in FIG. 18, substrate 1 has a first main surface 1a, a second main surface 1b located opposite to first main surface 1a, a first side surface 1c, and a second side surface 1d opposite to first side surface 1c.

Next, an intermediate layer formation step (S20), a superconducting material layer formation step (S30), and a protective layer formation step (S40) are performed in this order. The intermediate layer formation step, the superconducting material layer formation step, and the protective layer formation step are performed similarly to the corresponding steps in the first embodiment. After a protective layer 7 is formed on a superconducting material layer 5, oxygen annealing is performed to form a multilayer stack 20 having a dimension in the width direction of approximately 4 mm.

In this multilayer stack 20, intermediate layer 3, superconducting material layer 5, and protective layer 7 are each formed to cover side surfaces 1c, 1d of substrate 1 and extend onto at least a part of second main surface 1b as shown in FIG. 18. This is for the following reason. In the intermediate layer formation step, the superconducting material layer formation step, and the protective layer formation step, intermediate layer 3, superconducting material layer 5, and protective layer 7 are formed in order on first main surface 1a of substrate 1 and these layers are also formed on side surfaces 1c, 1d in addition to first main surface 1a.

Finally, in a stabilizing layer formation step (S60), a stabilizing layer 9 is formed on the periphery of multilayer stack 20, and thus superconducting wire 10 in the fourth embodiment shown in FIG. 18 is completed.

Fifth Embodiment

Figure 20:
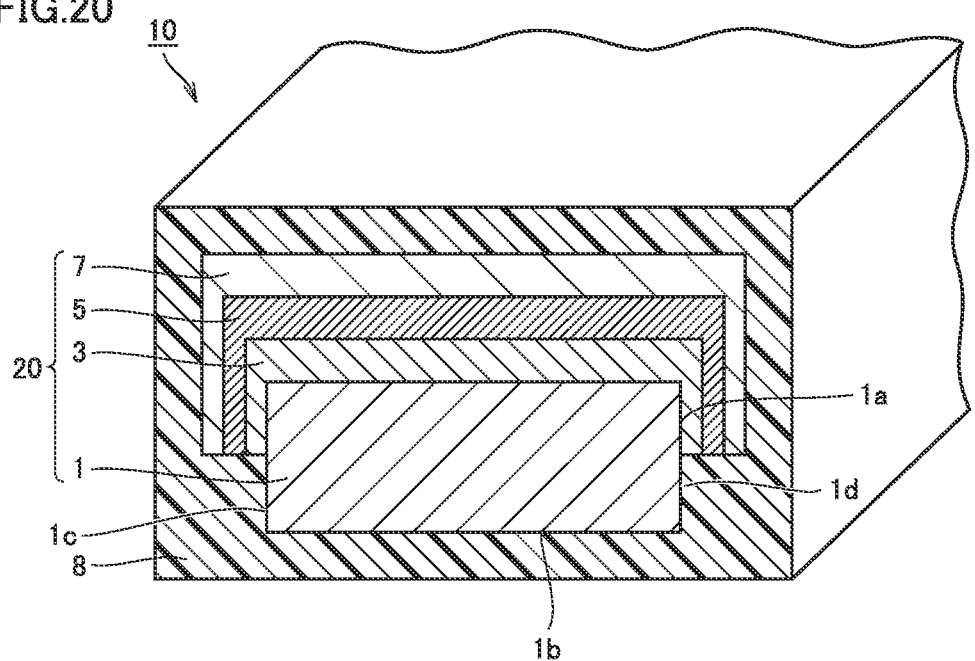
FIG. 20 is a schematic cross-sectional view showing a configuration of a superconducting wire in a fifth embodiment of the present invention.

FIG. 20 is a schematic cross-sectional view showing a configuration of a superconducting wire in a fifth embodiment of the present invention. FIG. 20 shows a cross section in the direction crossing the direction in which a superconducting wire in the fifth embodiment extends.

Referring to FIG. 20, superconducting wire 10 in the fifth embodiment has a configuration which is basically similar to that of superconducting wire 10 in the first embodiment as described above. However, superconducting wire 10 in the fifth embodiment differs from superconducting wire 10 in the first embodiment in that a protective layer is formed on the periphery of multilayer stack 20, instead of stabilizing layer 9.

In the fifth embodiment, a protective layer 8 is disposed to cover the outer periphery of multilayer stack 20 made up of substrate 1, intermediate layer 3, superconducting material layer 5, and protective layer 7, namely to cover substantially the whole outermost surface of multilayer stack 20. Preferably, this protective layer 8 is a thin film made of silver (Ag) or silver alloy for example and having a thickness of approximately 0.1 μm to 50 μm. In the following, protective layer 7 included in multilayer stack 20 is also referred to as "first protective layer" and protective layer 8 covering the outer periphery of multilayer stack 20 is also referred to as "second protective layer."

Figure 21:
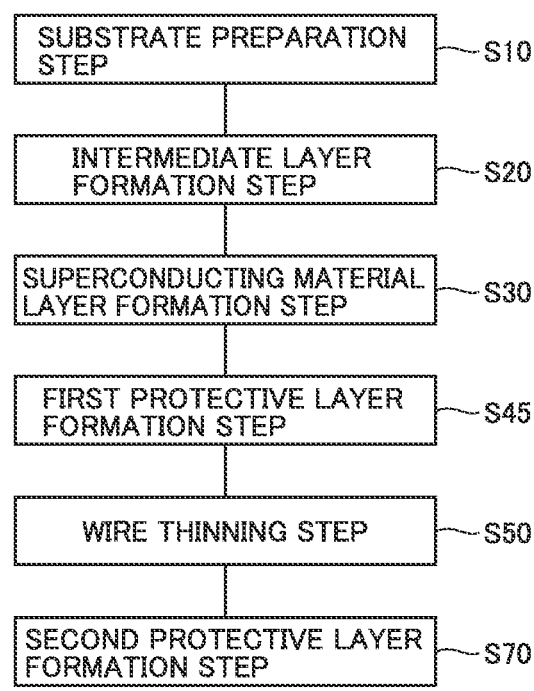
FIG. 21 is a flowchart showing a method of manufacturing a superconducting wire in the fifth embodiment.

FIG. 21 is a flowchart showing a method of manufacturing a superconducting wire in the fifth embodiment. Referring to FIG. 21, the method of manufacturing the superconducting wire in the fifth embodiment is basically similar to the method of manufacturing the superconducting wire in the first embodiment which is described above with reference to FIGS. 3 to 8. However, the fifth embodiment differs from the first embodiment in that the former includes a first protective layer formation step (S45) and a second protective layer formation step (S70) instead of the protective layer formation step (S40 in FIG. 3) and the stabilizing layer formation step (S60 in FIG. 3). Specifically, in the first protective layer formation step (S45), protective layer 7 made of silver (Ag) or silver alloy is formed for example by physical vapor deposition method, electroplating method, or the like, on the main surface of superconducting material layer 5 opposite to the main surface thereof facing intermediate layer 3, similarly to the protective layer formation step (S40 in FIG. 3) in the first embodiment.

In the second protective layer formation step (S70), protective layer 8 (second protective layer) made of silver (Ag) or silver alloy is formed for example by physical vapor deposition method, electroplating method, or the like, to cover the outer periphery of multilayer stack 20 having undergone the wire thinning, namely to cover substantially the whole outermost surface of multilayer stack 20. Through the above-described steps, superconducting wire 10 in the fifth embodiment shown in FIG. 20 is manufactured.

In the fifth embodiment, a stabilizing layer made of copper or copper alloy may be disposed to further cover the outer periphery of second protective layer 8, namely to cover substantially the whole outermost surface of second protective layer 8. In the case of disposing the stabilizing layer on the outer periphery of second protective layer 8, second protective layer 8 can be disposed to cover substantially the whole outermost surface of multilayer stack 20 to facilitate plating for forming a copper plating thin film serving as stabilizing layer 9 on multilayer stack 20 including second protective layer 8. Namely, stabilizing layer 9 is formed on the outer surface of second protective layer 8. During the plating, multilayer stack 20 is immersed in a copper plating solution. However, the surface of superconducting material layer 5 is not directly brought into contact with the copper plating solution, since the surface of superconducting material layer 5 is covered with second protective layer 8. Therefore, during the plating, corrosion of the surface and the inside of superconducting material layer 5 due to the copper plating solution can be suppressed. Moreover, when an adverse event such as quenching occurs to superconducting material layer 5, excessive current flowing in superconducting material layer 5 can be partially directed to flow in second protective layer 8. In this way, breakage or the like of superconducting material layer 5 due to excessive current flowing in superconducting material layer 5 can be suppressed.

Regarding the fifth embodiment, the feature that protective layer 8 (second protective layer) replaces stabilizing layer 9 of the superconducting wire in the first embodiment (FIG. 1) is illustrated above by way of example. However, in each of the superconducting wire in the second embodiment (FIG. 13), the superconducting wire in the third embodiment (FIGS. 14, 15), and the superconducting wire in the fourth embodiment (FIG. 18) as well, stabilizing layer 9 may be replaced with the protective layer (second protective layer). Alternatively, in respective superconducting wires in the second to fourth embodiments, the protective layer (second protective layer) can be disposed to cover the outer periphery of multilayer stack 20 and further the stabilizing layer can be disposed to cover the outer periphery of this protective layer.

Regarding the above first to fifth embodiments, the feature that the superconducting material layer at least partially covers the side surfaces of the substrate is illustrated above as a feature that the intermediate layer, the superconducting material layer, and the protective layer at least partially cover the side surfaces of the substrate. The present invention, however, is not limited to these embodiments, and further includes a feature that the intermediate layer and the superconducting material layer at least partially cover the side surfaces of the substrate, a feature that only the superconducting material layer partially covers the side surfaces of the substrate, and a feature that the superconducting material layer and the protective layer at least partially cover the side surfaces of the substrate. Among these features, the feature that the intermediate layer and the superconducting material layer at least partially cover the side surfaces of the substrate is preferred in that the orientation alignment of the superconducting material layer can also be improved on the side surfaces of the substrate and in that peeling of the intermediate layer can be prevented.

Moreover, regarding the above first to fifth embodiments, the feature that the stabilizing layer or the protective layer is formed to cover the outer periphery of the multilayer stack is illustrated above. Alternatively, the stabilizing layer or the protective layer may be disposed on at least the upper surface of the multilayer stack (namely on the protective layer). In this case, the stabilizing layer or the protective layer may be formed on the protective layer and thereafter the outer periphery of the superconducting wire may be covered with an insulating coating layer, in order to protect the superconducting wire.

Moreover, regarding the above first embodiment, the manufacturing method in which the wire thinning step (S50) is performed after the protective layer formation step (S40 in FIG. 3) is illustrated above. Alternatively, the wire thinning step (S50) may be performed after the superconducting material layer formation step (S30) and thereafter the protective layer formation step (S40) may be performed. Accordingly, the protective layer is formed to cover the outer periphery of the multilayer stack made up of the substrate, the intermediate layer, and the superconducting material layer. Therefore, first protective layer 7 and second protective layer 8 (FIG. 20) can be formed substantially simultaneously.

Moreover, the superconducting wire in the above second embodiment may also be manufactured by a method similar to the method of manufacturing a superconducting wire in the fourth embodiment. Namely, on one of the main surfaces of the substrate having a tape shape with a desired width, the intermediate layer, the superconducting material layer, and the stabilizing layer may be formed in order, to thereby form the intermediate layer, the superconducting material layer, and the stabilizing layer to entirely cover the side surfaces of the substrate.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST

1 substrate; 3 intermediate layer; 5 superconducting material layer; 7 protective layer (first protective layer); 8 protective layer (second protective layer); 9 stabilizing layer; 10 superconducting wire; 20 multilayer stack; 30 slitter; 31 rotary blade; 32 spacer

What is claimed is:

1. A superconducting wire comprising:
    a substrate having a first main surface and a second main surface opposite to the first main surface; and
    a superconducting material layer disposed on the first main surface of the substrate,
    the superconducting material layer being disposed to cover at least a part of a side surface of the substrate in a width direction of the substrate, and
    along at least a part of the superconducting wire in a direction in which the superconducting wire extends, the superconducting material layer being formed to cover the side surface of the substrate and extend onto at least a part of the second main surface.

2. The superconducting wire according to claim 1, wherein
    along at least a part of the superconducting wire in the direction in which the superconducting wire extends, the superconducting material layer is disposed to entirely cover the side surface of the substrate.

3. The superconducting wire according to claim 1, wherein
    the first main surface of the substrate includes a curved portion.

4. The superconducting wire according to claim 3, wherein
    the curved portion is located at an end of the first main surface of the substrate, in the width direction of the substrate.

5. The superconducting wire according to claim 1, wherein
    the superconducting material layer located on the side surface of the substrate has a thickness of not less than 0.5 μm and not more than 5 μm.

6. The superconducting wire according to claim 1, further comprising an intermediate layer disposed between the first main surface of the substrate and the superconducting material layer, wherein
    the intermediate layer is disposed to cover at least a part of the side surface of the substrate.

7. The superconducting wire according to claim 1, wherein
    the superconducting material layer is made of an oxide superconducting material.

8. The superconducting wire according to claim 1, wherein
    a thickness of the superconducting material layer located above the second main surface of the substrate is smaller than a thickness of the superconducting material layer located above the first main surface.

* * * * *